(12) United States Patent
Godfrey et al.

(10) Patent No.: US 6,550,031 B1
(45) Date of Patent: Apr. 15, 2003

(54) TRANSPARENTLY GATHERING A CHIPS MULTIPLE INTERNAL STATES VIA SCAN PATH AND A TRIGGER

(75) Inventors: Gary M. Godfrey, Austin, TX (US); Floyd Goodrich, III, Austin, TX (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/413,119

(22) Filed: Oct. 6, 1999

(51) Int. Cl.[7] .................................................. G06F 11/27
(52) U.S. Cl. ........................................ 714/726; 724/727
(58) Field of Search ............................... 714/726, 727, 714/724

(56) References Cited

U.S. PATENT DOCUMENTS

| | | | | |
|---|---|---|---|---|
| 5,598,421 A | * | 1/1997 | Tran et al. | 714/726 |
| 5,768,289 A | * | 6/1998 | James | 714/727 |
| 5,894,213 A | * | 4/1999 | Nakamura | 340/146.2 |

OTHER PUBLICATIONS

*Introduction to JTAG Boundary Scan*, microSPARC–IIep™, Sun MicroElectronics, Jan. 1997, cover pages, pp. 1 through 8.

*Designing for On–Board Programming Using the IEEE 1149.1 (JTAG) Access Port*, AP–630 Application Note, Intel Corporation, Nov. 1996, pp. 1 through 14.

* cited by examiner

Primary Examiner—Kenneth S. Kim
(74) Attorney, Agent, or Firm—Akin Gump Strauss Hauer & Feld LLP (57) ABSTRACT

A microcontroller has many miscellaneous logics. The miscellaneous logic can include input/outputs of combinational logic or peripheral devices of the microcontroller, storage devices such as latches, or registers. The miscellaneous logic is coupled to multiple stages of scan cells. The multiple stages can be used as a buffer while the last stage of scan cells are scanned out. A predetermined stage of scan cells are coupled together to form a scan path where data from the miscellaneous logic can be outputted to an external memory. In one embodiment, the predetermined stage is the last stage of scan cells. A trigger signal is used to shift the data from the miscellaneous logic to the next stage of scan cells. Once the last stage of scan cells are loaded, a clocking signal can be provided so that the data in the predetermined stage of scan cells is scanned out. The present invention provides among other things, a graceful way to capture data from miscellaneous logic of the microcontroller using scan hardware.

23 Claims, 8 Drawing Sheets

TRANSPARENTLY GATHERING A CHIPS MULTIPLE INTERNAL STATES VIA SCAN PATH AND A TRIGGER

BACKGROUND OF THE INVENTION

1. Field of the Invention

The apparatus and method according to the invention pertains to miscellaneous logic embedded in a microcontrollers, and more specifically, using computer software and scan hardware to capture data from the miscellaneous logic.

2. Description of the Related Art

The proliferation of electronic goods such as telephones, televisions, and video camcorders has been made possible by integrated circuit technology. One type of integrated circuit especially important to electronic devices is the microcontroller.

A microcontroller, or embedded controller, is similar to a microprocessor as used in a personal computer, but with a great deal of additional functionality combined onto the same monolithic semiconductor substrate (i.e., chip). In a typical personal computer, the microprocessor performs the basic computing functions, but other integrated circuits perform functions such as communicating over a network, providing input/output with the user, and controlling peripherals.

In a typical microcontroller, many of these functions are embedded within the integrated circuit chip itself A typical microcontroller, such as the Am186ES by Advanced Micro Devices, Inc., of Sunnyvale, Calif., not only includes a core microprocessor, but further includes a memory controller, a direct memory access (DMA) controller, an interrupt controller, and both asynchronous and synchronous serial interfaces. In computer systems, these peripheral devices are typically implemented as separate integrated circuits, requiring a larger area and increasing the size of the product. By embedding these functions within a single chip, size and cost are reduced, often important in consumer products.

From a consumer products designer's viewpoint, often the particular combination of added features make a particular microcontroller attractive for a given application. Many microcontrollers are available that use the standard 80×86 microprocessor instructions, allowing for software to be easily developed for such microcontrollers. Because of the similar execution unit instruction sets, the added features often become principal differentiating criteria between particular microcontrollers.

The miscellaneous logic embedded in a microcontroller can be input/outputs of combinational logic, memory devices such as latches, or registers of a peripheral device embedded in the microcontroller. Typical peripheral device registers include state registers, instruction registers, address registers, status registers and data registers. Depending on the peripheral, certain registers store configuration information needed for the peripheral's proper operation during start up. On system start up, the execution unit initializes each peripheral device with device specific initial configuration-data. This initialization could occur during a cold start-up, zero-volt suspend/resume procedure or after a system crash.

In addition to having peripheral devices, many of today's microcontrollers have embedded test circuitry. In 1985, a group of European companies formed Joint European Test Action Group (JETAG) to devise ways to reduce manufacturing costs. One concept was to incorporate such test circuitry into standard components (controlled via software), eliminating the need for sophisticated in-circuit test equipment. This concept gained support in the U.S., where in 1988, several North American companies formed the Joint Test Access Group (JTAG) consortium to formalize the concept. In 1990, the Institute of Electrical and Electronic Engineers (IEEE) refined the concept and created the 1149.1 standard (which is incorporated herein by reference), known as IEEE Standard Test Access Port and Boundary Scan Architecture. In addition to microcontrollers, JTAG circuitry can be incorporated into microprocessors, applications specific integrated circuits (ASICs), or any other discrete device that conforms to the IEEE 1149.1 specification.

In the JTAG architecture, a JTAG test device is connected to a microcontroller and performs a "boundary-scan test" on the microcontroller. Boundary scan cells contain shift register elements that connect together to form a scan path around the core logic circuit. Input/Output (I/O) signals freely pass between integrated circuit (IC) pins and the core logic, through the boundary scan cells, in normal mode. However, in test mode, only test signals are allowed to pass into or out of the core logic, via a test port and through the boundary scan chain, providing observability and controllability of the input and output signals. The JTAG test commands are typically drawn from a fairly limited set of commands particularly adapted for testing the interconnections of microcontrollers and are not typically well suited for testing or monitoring its internal logic. Instructions and associated data for testing are read serially into each microcontroller peripheral boundary scan cell registers and read out serially, and after the instructions has been carried out the result is read out serially.

Also, access to miscellaneous logic of the microcontroller may not be possible using processor I/O commands. Some of miscellaneous logic may not have both read/write capabilities. Thus, data cannot be written to miscellaneous logic such as read-only registers with processor I/O commands and data cannot be read from miscellaneous logic such as write-only registers with processor I/O commands.

In addition, traditional scan techniques required a system to halt so that scan data could be shifted into the scan path. This technique for scanning out data would generally be unacceptable for real-time systems. Furthermore, for capturing scan data for miscellaneous logic the microcontrollers would generally need to be halted so that the miscellaneous logic can output their data onto the scan path. Thus, capturing data can possibly reduce device throughput.

SUMMARY OF THE INVENTION

According to the present invention, a scan path is used to capture data of miscellaneous logic embedded in a microcontroller, such as input/outputs of combinational logic, memory devices such as latches, peripherals in a microcontroller, or a discrete device incorporating scan hardware. The data is captured in scan cells, such as latches or flip-flops, but the scan cells are implemented in multiple stages. There can be up to N stages of scan cells, where N is greater than 1. Each miscellaneous logic is coupled to a corresponding scan cell of a 1st stage; each 1st state scan cell is coupled to a corresponding 2nd stage state scan cell, and so on. These additional stages of scan cells allow multiple "snapshots" of the scanned logic to be taken without first scanning previous "snapshots". Each stage of state scan cells can store input/output data of the miscellaneous logic and can eventually be scanned out. At least the Nth stage of scan cells are serially coupled together to form a scan path.

Should the miscellaneous logic be peripherals embedded in the microcontroller, the scan paths of each peripheral are preferably serially coupled together. If desired, the scanned information can be used for diagnostics, among other things.

The capturing of data can occur while the microcontroller is running other applications. It is unnecessary to halt the microcontroller to capture the data. In addition, the use of multiple stages of scan cells allows the storage of the data should it be impossible to scan the data out as quickly as it is captured.

A trigger can be used to capture the data of the miscellaneous logic into scan cells. When the scan cells are triggered, the data in the miscellaneous logic are loaded into the 1st stage of state scan cells. In addition, the states in the 1st stage of scan cells are loaded into the 2nd stage, and so on, up to the Nth stage of scan cells. The trigger can be initiated under certain criteria. The criteria can be activation of the trigger by an operator, the happening of an event, the lapse of a predetermined time period, or on other conditions.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

The following disclosure is hereby incorporated by reference: The assignee of the present invention, Advanced Micro Devices, Inc., has addressed a scan path for loading, saving configuration data of peripheral devices embedded in a microcontroller, as disclosed in U.S. patent application Ser. No. 09/209,190, entitled "METHOD AND APPARATUS FOR SAVING PERIPHERAL AUTOMATIC CONFIGURATION/CPU REGISTER SAVE/RESTORE FROM EXTERNAL MEMORY STATES OF A MICROCONTROLLER" filed Dec. 10, 1998, and U.S. patent application Ser. No. 09/209,119, entitled "INITIALIZING AND SAVING PERIPHERAL DEVICE CONFIGURATION STATES OF A MICROCONTROLLER USING A UTILITY PROGRAM" filed Dec. 10, 1998, both herein incorporated by reference as if set forth in its entirety.

Figure 1:
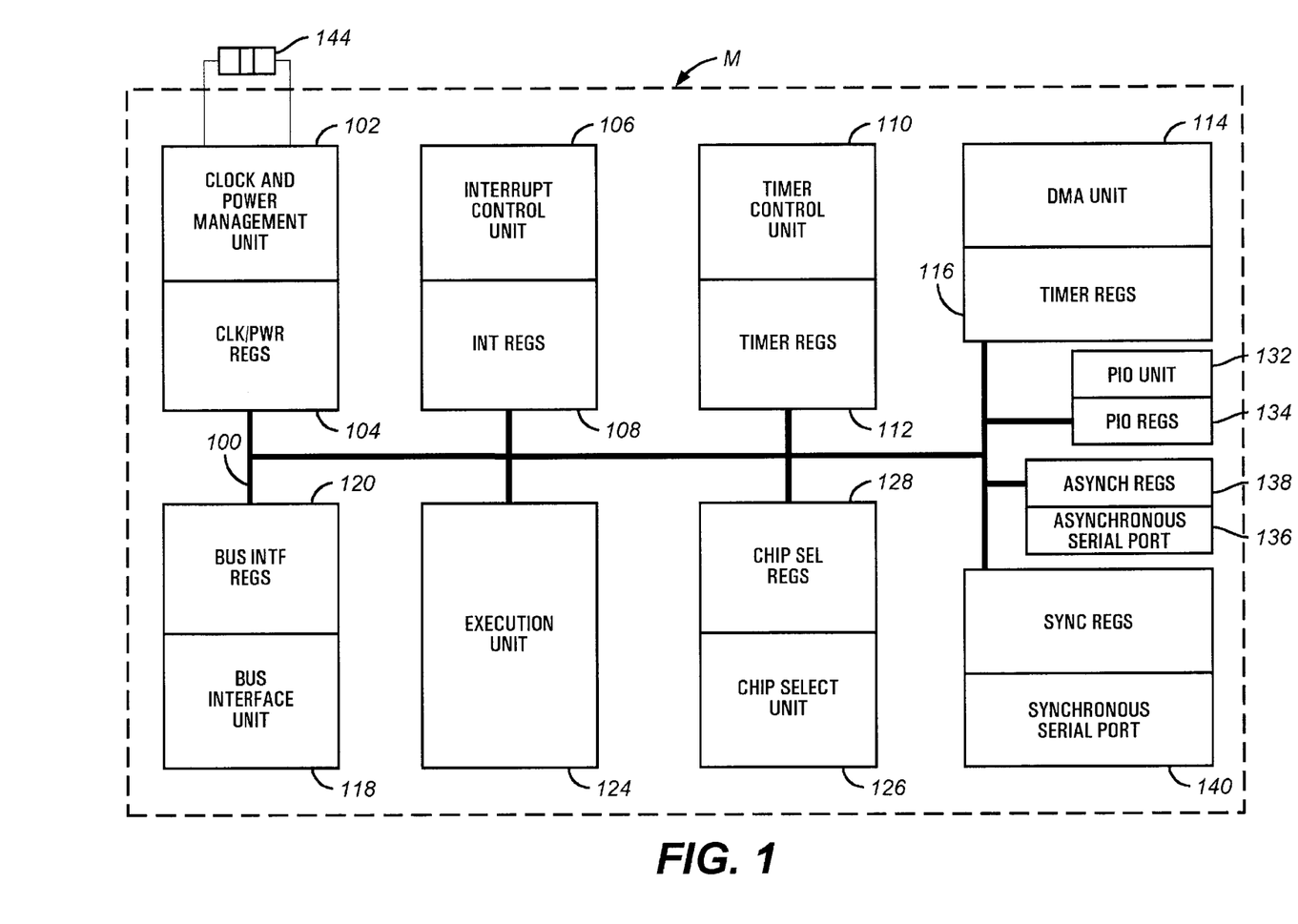
FIG. 1 shows a typical microcontroller in which the techniques of this invention can be implemented.

Turning to FIG. 1, shown is a block diagram of a typical microcontroller M implemented according to the invention. Such a microcontroller M is preferably implemented on a single monolithic integrated circuit. The microcontroller M preferably includes an internal bus 100 coupling a variety of functional units and registers (herein referred to as peripheral devices except the execution unit), used to control and monitor those units. These peripheral devices include a clock and power management unit 102 with corresponding clock/power registers 104, an interrupt control unit (ICU) 106 with corresponding interrupt registers 108, a timer control unit 110 with corresponding timer registers 112, a direct memory access (DMA) unit 114 with corresponding DMA registers 116, a bus interface unit 118 with corresponding bus interface registers 120, an execution unit 124 which is essentially a microprocessor core, a chip select unit 126 with corresponding chip select registers 128, a programmable input/output (PIO) unit 132 with corresponding PIO registers 134, an asynchronous serial port 136 with corresponding asynchronous register 138, and a synchronous serial port 140 with corresponding synchronous registers 142. Further, note the clock and power management unit 102 includes external pads connected to a crystal 144, which provides the timing not only for the execution unit 124, but also for generating the serial clock in the asynchronous serial port 136.

The block diagram of the microcontroller M is typical of microcontrollers, and could be for example, the Am186ES microcontroller by Advanced Micro Devices, Inc., of Sunnyvale, Calif. The techniques and circuitry according to the invention, however, could be applied to a wide variety of microcontrollers as well as other devices that use a non-ideal clock for generation of asynchronous serial port clocks. Further, the term "microcontroller" has differing definitions in industry. Some companies refer to a processor core with additional features (such as I/O) as a "microprocessor" if it has no onboard memory, and digital signal processors (DSPs) are now used for both special and general purpose controller functions. So as here used, the term "microcontroller" covers all of the products, and generally means an execution unit with added functionality all implemented on a single monolithic integrated circuit.

SCAN HARDWARE

Microcontrollers that are IEEE 1149.1 compliant have boundary scan paths that couple the boundary scan cells of peripheral device's I/O pins. A boundary scan provides access to the periphery of the microcontroller or its devices, but not the internal elements or circuitry of the execution unit and peripheral devices. In a full scan path design, internal signals are also connected in the scan paths. The scan paths connect individual scan cells, such as latches or flip-flops and then connect one scan cell to the next scan cell.

Figure 2:
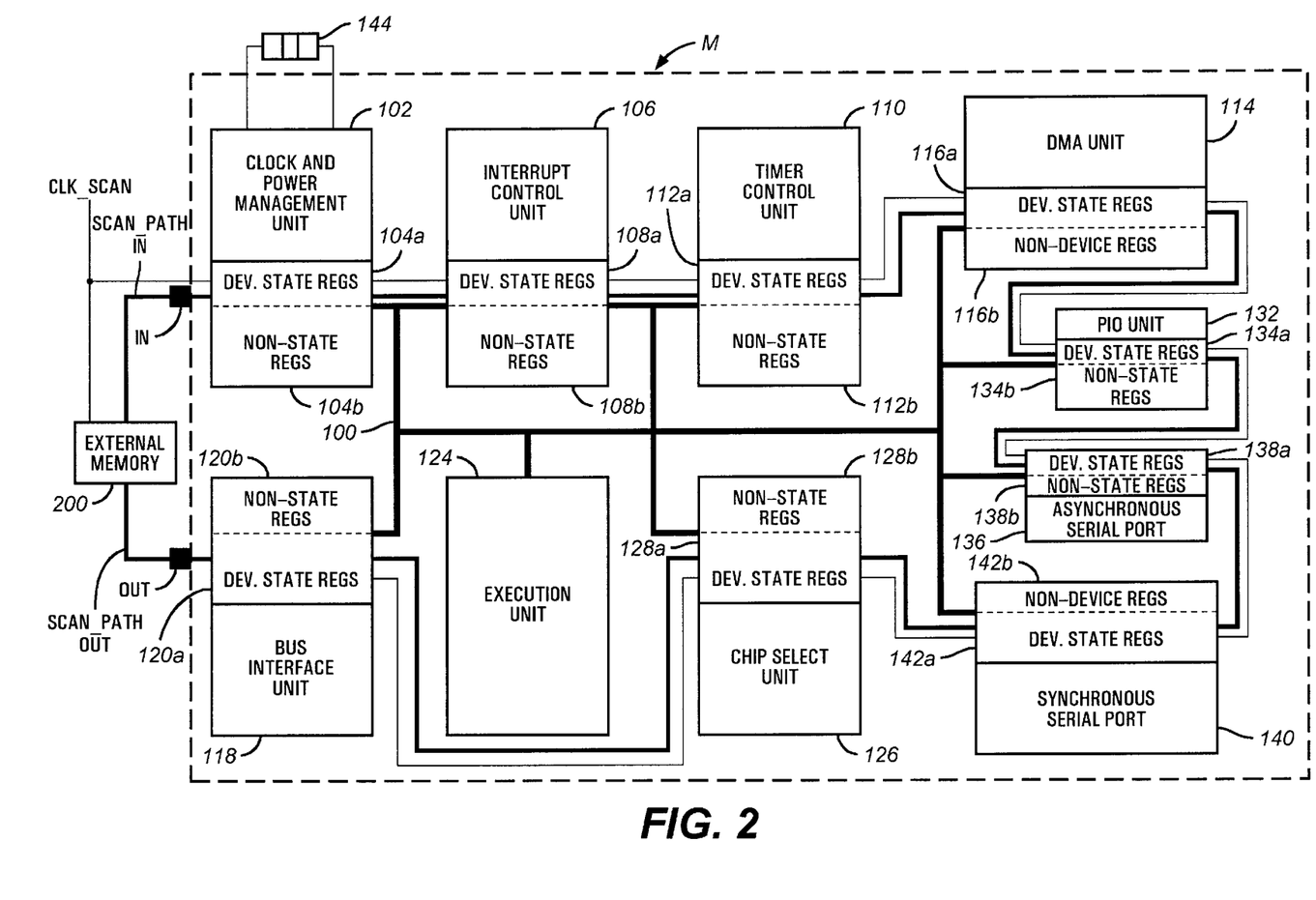
FIG. 2 is a block diagram illustrating a scan path between peripheral devices.

FIG. 2 illustrates peripheral devices embedded in a microcontroller M with a scan path. In one embodiment, configuration states in the form of registers of peripheral devices of the microcontroller M are coupled to a scan path. An input pin IN of microcontroller M is provided to shift configuration data into each peripheral configuration state register. The configuration state registers of the clock and power management unit 102, the interrupt control unit 106, the timer control unit 110, the DMA unit 114, the PIO unit 132, the asynchronous serial port 136, the synchronous serial port 140, the chip select unit 126 and the bus interface unit 118 are daisy chained (i.e., serially connected) together via signal line SCAN_PATH. For illustrative purposes, the SCAN_PATH line from the output of the bus interface unit configuration registers 120a is coupled to the output pin OUT of the microcontroller M. Configuration state scan data is synchronously shifted in or out of each configuration register utilizing clock CLK_SCAN. The configuration scan data out pin OUT is coupled to an external memory 200. Thus, the configuration scan data from each peripheral device is sequentially shifted out of each configuration register into external memory 200 via SCAN_PATH. Likewise, the external memory 200 is coupled to the input pin IN, so that configuration scan data from external memory 200 can be synchronously shifted into each peripheral configuration register via SCAN_PATH.

PERIPHERAL DEVICE REGISTERS

Figure 3:
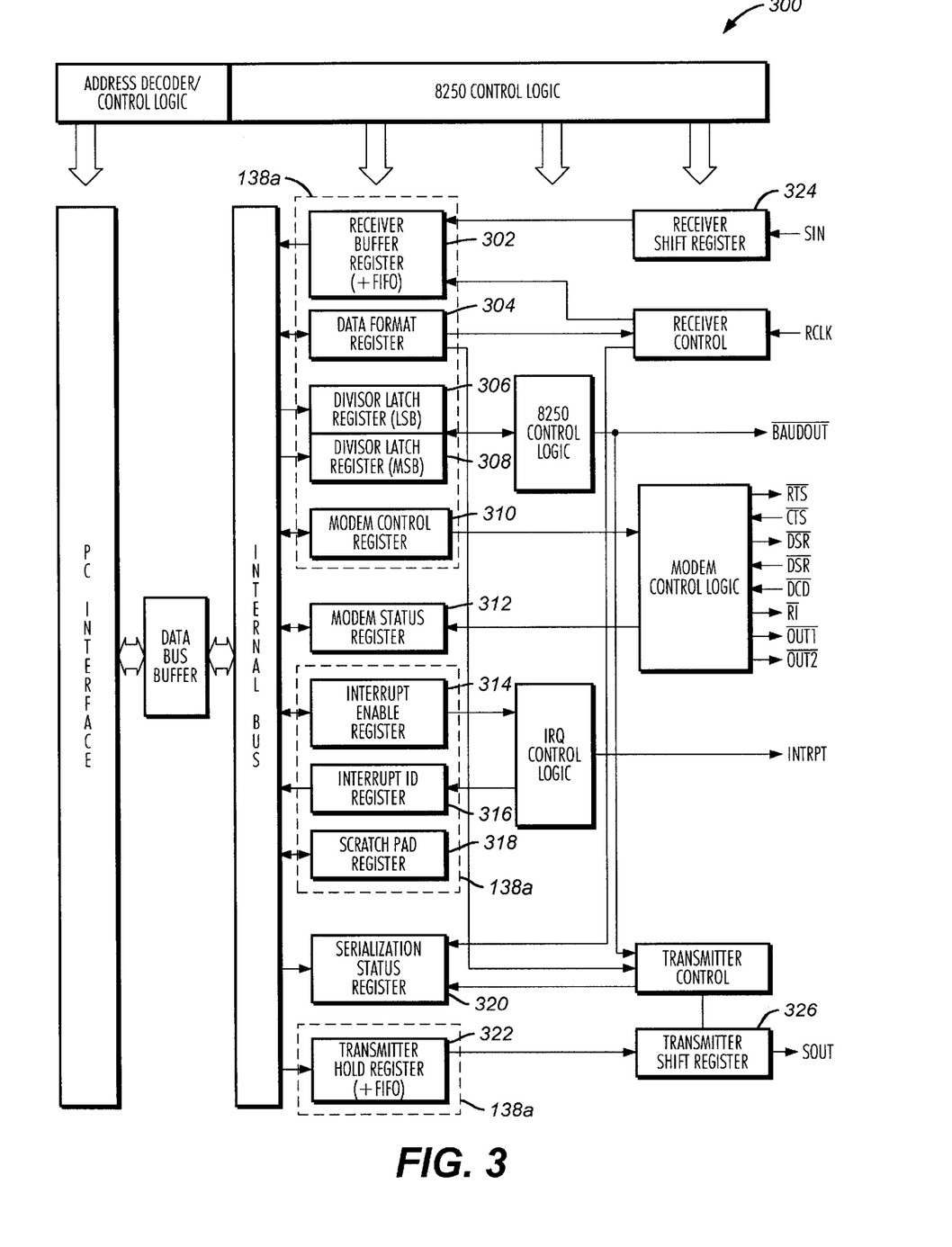
FIG. 3 is a block diagram illustrating the internal elements of a peripheral device, namely a universal asynchronous receiver and transmitter (UART)

The peripheral devices embedded in microcontrollers have many different registers that store data for use in a variety of functions. Sometimes, registers necessarily define a configuration state of a peripheral. Other times, registers contain transitory information (such as UART receive status bits) that are not strictly needed to establish the peripheral's configuration. Further, whether a register has information "necessary" to define a peripheral configuration state may depend on the particular implementation of the peripheral and its applications. As an illustration, one such peripheral device is an asynchronous serial port 136. A common asynchronous serial port is a Universal Asynchronous Receiver and Transmitter (UART) 300. The UART 300 is one peripheral that provides a serial interface of the microcontroller M. Some of the peripheral's functions include the serialization of parallel data and the insertion of start, parity, and stop bits, or the parallelization of serial data and the separation of start, parity, and stop bits.

FIG. 3 is a block diagram of a typical implementation of the UART 300. The UART 300 generally has eleven configuration and status registers. The configuration state registers include a receiver buffer register 302, a data format register 304, a divisor latch register (LSB) 306, a divisor latch register (MSB) 308, a modem control register 310, an interrupt enable register 314, an interrupt ID register 316, a scratch pad register 318, and a transmitter hold register 322. The status registers include a modem status register 312 and a serialization status register 320. The registers provide the necessary storage area for interfacing the UART 300 to the rest of the peripheral devices of microcontroller M.

PERIPHERAL DEVICE STATE REGISTERS

Figure 4:
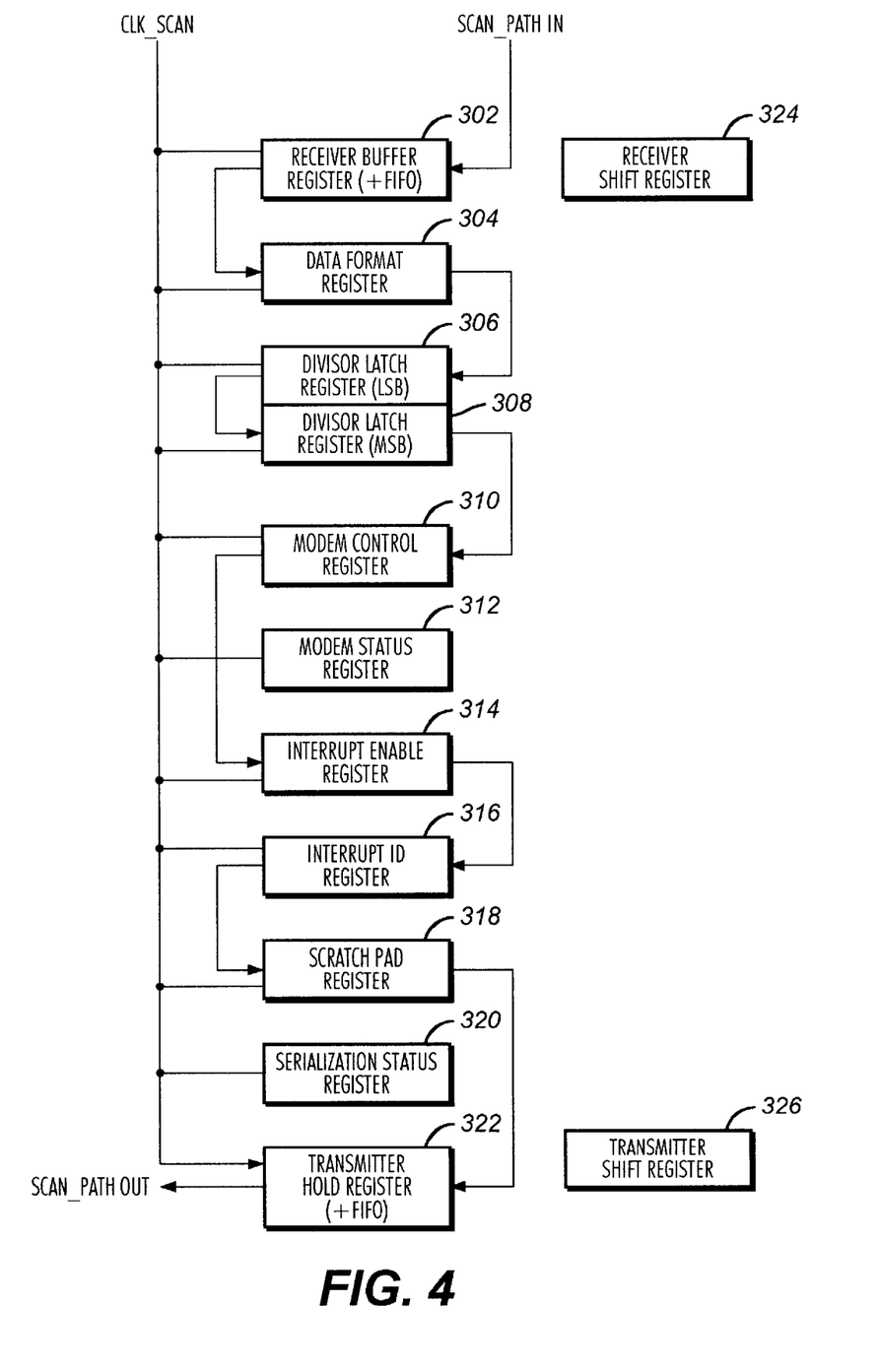
FIG. 4 is a block diagram illustrating multiple stage state scan cells within a peripheral device, such as an UART.

FIG. 4 is a block diagram of peripheral configuration state registers of a peripheral device. For illustrative purposes, the registers from the UART 300 are shown. Since it is typically not necessary to capture the data from all registers, those registers used to define the peripheral device's configuration state are identified. For example, in this implementation, the status registers 312 and 320, the receiver shift register 324 and the transmitter shift register 326 of the device are left out of the scan path. Thus, the peripheral configuration state registers 138*a* of the UART 300 include the receiver buffer register 302, the data format register 304, the data latch register (LSB) 306, the divisor latch register (MSB) 308, the model control register 310, the interrupt enable register 314, the interrupt ID register 316, the scratch pad register 318 and the transmitter hold register 322.

One skilled in the art could appreciate that inclusion or exclusion of particular registers to be saved can be different from system to system. That is, some predetermined subset of configuration state registers could differ according to the system. For example, in a high speed system that quickly restarts, it might be desirable to include the status registers in a scan path. Thus, the modem status register 312 and/or the serialization status register 320 of the UART 300 can be included in the peripheral configuration state registers 138*a* for scanning.

In addition, internal registers (as opposed to I/O registers) can be included in the peripheral configuration state registers 138*a*. The contents of these registers are typically not ascertainable without debug tools or the addition of shadow registers, but it might be desirable to include these registers in the scan path. For example, the receiver shift register 324 and/or the transmitter shift register 326 of the UART 300 can be included in the group of peripheral configuration state registers 138*a*.

Furthermore, externally accessible registers (I/O registers) may have read, write, or read/write capabilities. But using standard I/O commands in data cannot be saved from write-only registers. As an example, the transmitter hold register 322 is typically a write-only register. The configuration data normally cannot be saved from this register with a read command from execution unit 124.

Finally, an example of a peripheral device with external registers that cannot be accessed easily by software due to the nature of the hardware. One example is the interrupt control unit 106. A common interrupt control unit is the legacy 8259A style programmable interrupt controller. This controller uses four initialization control words, such as Initialization Command Words (ICW) ICW1–ICW4, which are written sequentially into the device via a single I/O port to four registers. The four registers can be included as configuration registers 108*a* and are typically write-only registers. Therefore, the registers cannot be read back out. As shown in FIG. 2, coupling the peripheral configuration state registers 108*a* to the scan path, configuration scan data of the interrupt control unit 106 can be loaded into the external memory 200.

MEMORY STORAGE DEVICE

The configuration scan data that is clocked out of the peripheral devices could be stored in an external memory 200. The configuration scan data can also be clocked into the peripheral device from the external memory 200. Various memory storage devices could be utilized, both volatile and non-volatile. One embodiment of the present invention would utilize a reprogrammable ROM. Several types of ROMs are available for storing a boot block and the configuration scan data. The first generation of ROMs had its code hardwired internally and could not be reprogrammed later. Should it become necessary to update the ROMs code, the ROM typically would have to be replaced with another ROM that had the updated code.

IEEE 1149.1 JTAG BOUNDARY SCAN AND TEST ACCESS PORT

Another embodiment of the invention utilizes the JTAG boundary scan path and Test Access Port (TAP) hardware to save the configuration data of the peripheral devices or load the configuration data into the peripheral devices. For microcontrollers that are IEEE 1149.1 compliant, the scan paths SCAN_PATH for each peripheral configuration register can be coupled to the boundary scan. The IEEE 1149.1 standard (May 21, 1990), is described in the publication IEEE Standard Test Access Port and Boundary-Scan Architecture, published by the IEEE, Piscataway, N.J. (herein incorporated by reference.)

A command instruction is loaded through the TAP. When the registers are clocked, the configuration data is shifted out of the peripheral device register onto the boundary scan path. In addition, the memory storage device could be coupled to the Test Access Port for easy load/storage of configuration data.

INTERNAL STORAGE ELEMENTS

Figure 5:
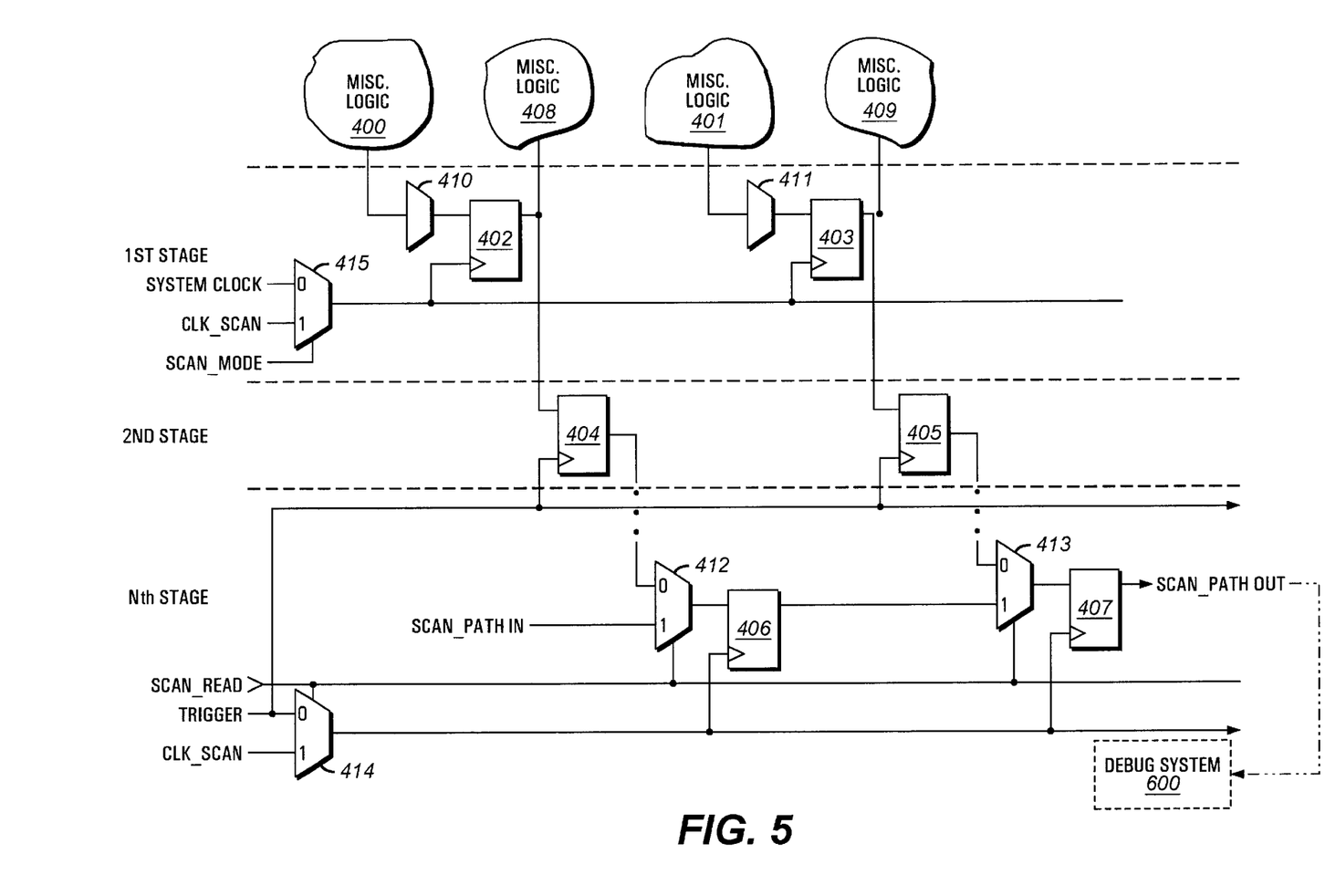
FIG. 5 is a block diagram illustrating multiple stages of scan cells for saving data from miscellaneous logic.

FIG. 5 is a block diagram for saving data from miscellaneous logics in multiple N stages of scan cells wherein the scan cells of the Nth stage form a scan path. N is a finite number which is greater than one. The scan cells could be a variety of devices such as a latch. Signals from a miscellaneous logic 400 is coupled to a latch 402 via a multiplexor 410. An output of the latch 402 is coupled to a latch 404. The output of the latch 404 is coupled to a latch 406. Similarly, signals from a miscellaneous logic 401 is coupled to a latch 403 via a multiplexor 411. An output of the latch 403 is coupled to a latch 405. An output of the latch 405 is coupled to the latch 407. Latches 402 and 403 are generally but a subset of scan cells of a first stage. Likewise, latches 404, 405 are generally but a subset of scan cells of a second stage. Latches 406, 407 are generally but a subset of scan cells of an Nth stage that typically makes up the SCAN_PATH.

A multiplexor 415 generally provides a system clock to latches 402, 403 when the microcontroller M is in a normal mode. When the microcontroller M is in a scan mode, a SCAN_MODE signal is provided to the multiplexor 415, and the multiplexor 415 can provide a CLK_SCAN signal to laches 402, 403. Data from outputs of latches 402, 403 can be provided to corresponding latches of a second stage.

Data can be downloaded from scan cells of the second and subsequent stage to the next stage when a TRIGGER is applied to the latches of the second stage through the Nth stage. Thus, when the TRIGGER is applied to latches 404 and 405, data from latches 404 and 405 can be provided to the latches of the next stage. The data from the latches of the (N–1) stage is provided to multiplexors of the Nth stage. (in this Figure, data from the latch 404 is provided to a multiplexor 412, and data from the latch 405 is provided to a multiplexor 413). The multiplexor 412 provides the data from the latch 404 to the latch 406, unless the multiplexor 412 receives a SCAN_READ signal. When the SCAN_READ signal is provided to the multiplexor 412, data from a preceeding boundary cell (or latch) in the SCAN_PATH (denoted as SCAN_PATH IN in this Figure) can be provided to the latch 406. An output of the latch 406 is provided to the multiplexor 413. Similarily, data from the output of the latch 405 can be provided to the latch 407, unless the multiplexor 413 receives the SCAN_READ signal, wherein the output of latch 406 is provided to the latch 407. The output of the latch 407 (denoted as SCANPATH OUT in this Figure) is provided to a multiplexor of a next latch (not shown) in the SCAN_PATH.

Data is scanned out of the latches of the Nth stage when the latches receive a clock CLK_SCAN. The CLK_SCAN signal is provided to a multiplexor 414. The TRIGGER is also provided to the multiplexor 414. The TRIGGER can be provided to the latches of the Nth stage, unless the multiplexor 414 receives a SCAN_READ signal. When the multiplexor 414 receives the SCAN_READ signal, the CLK_SCAN clock signal can be provided to latches 406, 407. Data is then serially shifted from latch 406 to the latch 407 in the SCAN_PATH. The data can be stored in a debug system 600. As noted previously, when the Nth stage latches receive the TRIGGER, data can be loaded into the Nth stage latches from the output of the (N–1) stage latches. Furthermore, as the figure illustrates, there can be many stages of latches. Thus, the scan cells of N stages provide a buffer, should it be impossible or inconvenient to scan out the data as quickly as they are captured.

MULTI-STAGE STATE REGISTERS

Figure 6:
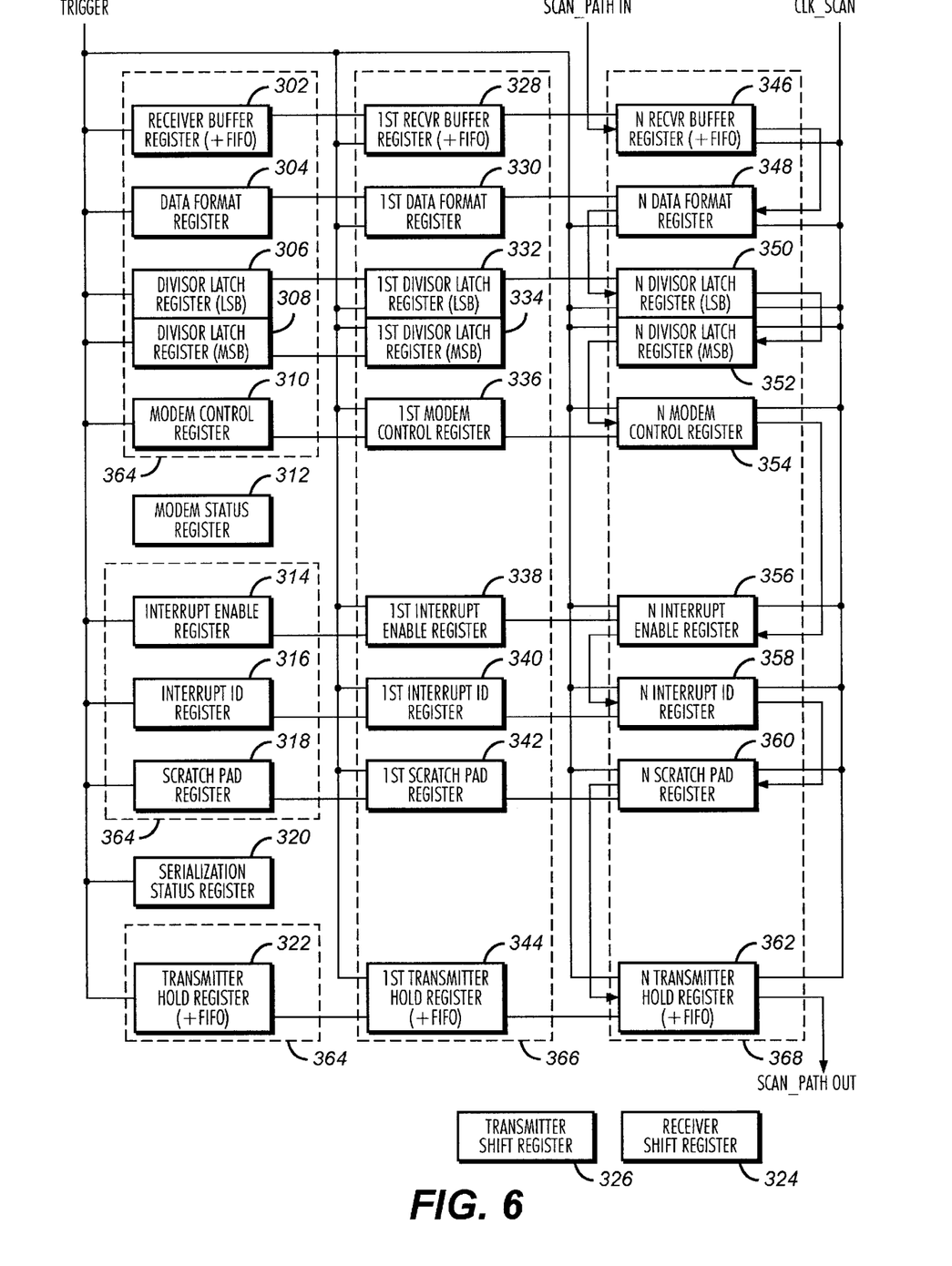
FIG. 6 illustrates N stages of scan cells such as state registers coupled to a scan path.

FIG. 6 illustrates another embodiment using N stages of scan cells such as state registers coupled to a scan path, according to the present invention. As an example, the registers of a peripheral device, such as the UART 300, is shown. Since it may not be necessary to capture the data from all registers, the SCAN_PATH couples only those registers under examination. The peripheral state registers 138a are coupled to 1st stage of state registers. For example, it may be desirable to capture the device state registers for the UART 300. The state registers are the receiver buffer (+FIFO) register 302, a data format register 304, a divisor latch register (LSB) 306, a divisor latch register (MSB) 308, a modem control register 310, an interrupt enable register 314, an ID register 316, a scratch pad register 318, and a transmitter holder register (+FIFO) 322. Of course, one skilled in the art would recognize that any set of registers could be coupled to the SCAN_PATH.

Each peripheral device state register 138a is coupled to a parallel 1st stage state of registers 366. Each 1st stage state registers 366 is coupled to the next stage registers (up to N stage state registers 368). For example, one of the peripheral device state registers 138a is the data format register 304. The data format register 304 is coupled to a 1st data format register 330. The 1st data format register 330 is one register among others in the 1st stage state registers 366. The 1st data format register 330 is coupled to the next data format register (not shown), and this register is coupled to an N data format register 348. The N data format register 348 is but one register in the N stage set registers 368. N equals the number of peripheral state stages. Thus, it is possible to store many states while the N state registers 368 are scanned. The coupling of each peripheral device state registers 138a, 1st stage state registers 366, . . . , N–1 stage state registers (not shown), and N stage state registers 368 form a multi-stage state path.

A TRIGGER signal is provided to each peripheral state registers 138a, 1st stage state registers 366, . . . , N–1 stage state register (not shown) and N stage state registers 368. The TRIGGER signal could originate internally in microcontroller M or externally from microcontroller M. When the TRIGGER signal is provided to the state registers, data is shifted from one register to its corresponding parallel state register. Referring to FIG. 5, for example, when the TRIGGER signal is provided to data format register 304, 1st data format register 330, and N data format register 348, data from data format register 304 is sequentially shifted to first data format register 330. In addition, data from the 1st data format register 330 is sequentially shifted to its corresponding parallel register. Last, the N data format register 348 is loaded with data from its corresponding parallel N–1 stage state register (not shown). Since the N data format register 368 is at the end of the multi-stage state path, the data from the N–1 stage state registers (not shown) to the N data format register's 368 will replace the N stage state register 368 existing data.

The N stage state registers 368 are serially coupled to form a segment of a peripheral device SCAN_PATH. Each segment of the peripheral device SCAN_PATH are serially coupled together to form a SCAN_PATH for the microcontroller M.

Figure 7:
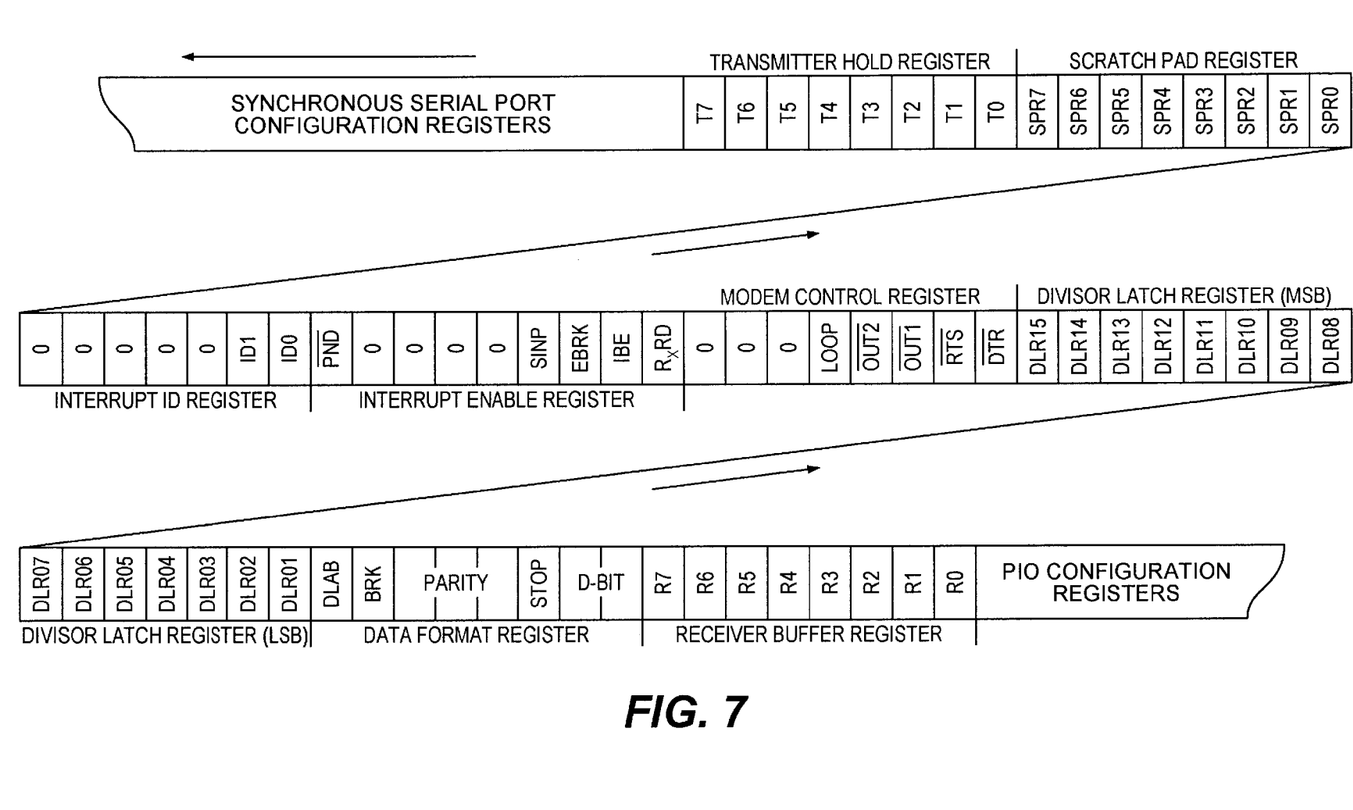
FIG. 7 illustrates a configuration state data stream.

FIG. 7 illustrates a typical SCAN_PATH data stream. The configuration data is sequentially read from the configuration registers of the peripheral devices of microcontroller M via SCAN_PATH. Since the configuration data is sequentially saved from all configuration state registers, the configuration scan data preceding the UART configuration state data is synchronous serial port configuration state data, as shown in the exemplary layout of peripheral devices in FIG. 2. Likewise, the configuration scan data after the UART configuration data is for the PIO configuration state registers 134a. The order of the configuration scan data is dependent on the layout of the peripheral devices and the particular microcontroller M and how they are coupled to the SCAN_PATH.

Figure 8:
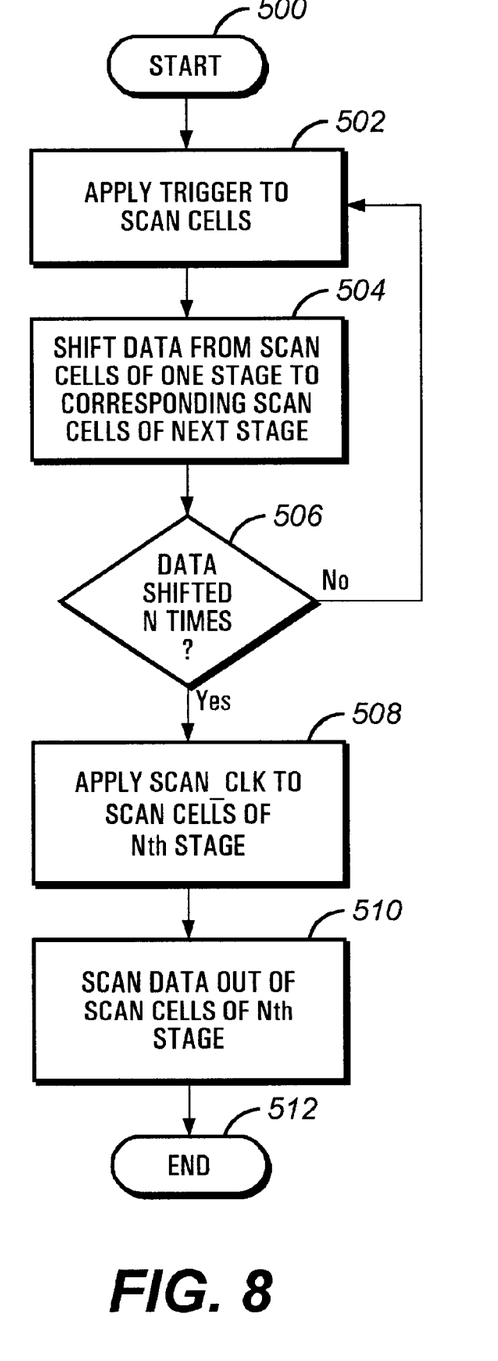
FIG. 8 is a flow chart illustrating a method for saving data using multiple stage scan cells.

FIG. 8 is a flow chart illustrating a method of scanning multi-stage scan cells. The method starts at step 500. A TRIGGER signal is applied to the scan cells at step 502. At step 504, data is shifted from one stage of scan cells to the next stage of scan cells in a multi-stage scan cell arrangement. At step 506, if the data is not shifted N−1 times, another TRIGGER signal is applied to the scan cells at step 502. If the data is shifted N−1 times at step 506, a CLK_SCAN signal is applied to the scan cells of Nth stage at step 508. Next, at step 510, the scan cells of the Nth stage data is scanned out. The method ends at step 512.

DEBUG SYSTEM

One embodiment of the invention utilizes a debug system for the capturing data via a scan path. As illustrated in FIG. 5, data from the SCAN_PATH could be shifted into a debug system 600 for later examination. As discussed previously, "snapshots" of data could be stored in each stage of scan cells for later debug and test. Next, a clocking signal can be applied to the scan cells that form the SCAN_PATH to shift data into the debug system 600. The debug system 600, such as an external tester or analyzer, can capture the scanned data, analyze the scanned data, and display the results in a manner that is useful to test personnel.

While in the illustrative embodiment the Nth stage of scan cells are shown connected into a scan path, it would be possible to include other stages, such as a predetermined stage, in the same or a different scan path as well. For example, by employing the first stage of scan cells in one scan path and the scan cells of the Nth stage in another, one can immediately obtain information about the state of the device using the first stage of scan cells, while one could use the Nth stage of scan cells for gathering data after a number of events had been triggered. Thus, the first stage scan path could be used for immediate scan data, while the Nth stage scan path can be used for cumulative diagnostics.

Further, although the intermediate stages of the scan path have been termed "scan cells", one will appreciate that if they are not on the scan path, the scan cells of intermediate stages are simply intermediate flip flops for storage elements, buffering data that is ultimately scanned via the last stage of scan cells.

One will appreciate that employing the multiple stages, debugging of critical timed events is assisted because multiple "snapshots" of the system can be taken without the need to scan the data out (and stop the execution unit) between such events.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A microcontroller having scan hardware for saving device states, comprising:
 a plurality of miscellaneous logic, said plurality of miscellaneous logic includes the device states;
 scan cells of N stages, wherein N equals 2 to n, wherein the scan cells of the first stage are coupled to corresponding miscellaneous logic;
 wherein the scan cells of each stage are coupled to corresponding scan cells of a next stage; and
 wherein scan logic shifts the device states from the scan cells of a predetermined stage.

2. The microcontroller of claim 1 further comprising a trigger applied to each of the scan cells of N stages to shift data from scan cells of one stage to the corresponding scan cells of the next stage.

3. The microcontroller of claim 1 wherein the miscellaneous logic are registers.

4. The microcontroller of claim 1 further comprising an execution unit.

5. The microcontroller of claim 1 wherein the miscellaneous logic includes configuration registers accessible through read and write commands from an execution unit.

6. The microcontroller of claim 1 wherein the miscellaneous logic includes internal registers inaccessible through read and write commands from an execution unit.

7. The microcontroller of claim 1 wherein the miscellaneous logic includes registers that are write-only when written by an execution unit.

8. The microcontroller of claim 1 wherein the miscellaneous logic includes a synchronous serial port.

9. The microcontroller of claim 1 wherein the miscellaneous logic includes a DMA unit.

10. The microcontroller of claim 1 wherein the miscellaneous logic includes an interrupt control unit.

11. The microcontroller of claim 1 wherein n=2.

12. The microcontroller of claim 1 wherein n>2.

13. The microcontroller of claim 1 further comprising a scan path that includes scan cells of the predetermined stage, and wherein N does not equal n.

14. The microcontroller of claim 1 wherein the scan cells of the predetermined stage form a scan path, and wherein N equals n.

15. The microcontroller of claim 14 wherein the scan path is in accordance with IEEE 1149.1 bus standard.

16. A microcontroller having scan hardware for saving device states, comprising:
 means for capturing scanned data from miscellaneous logic and providing the scanned data to scan cells of a first stage of N stages, wherein N equals 2 to n, said scanned data includes the device states;
 means for shifting the scanned data from scan cells of one stage to corresponding scan cells of a next stage, a predetermined number of times; and
 means for shifting out the scanned data from scan cells of a predetermined stage via a scan path.

17. A method of saving data of a microcontroller, the microcontroller including a plurality of miscellaneous logic, scan cells of N stages, wherein N equals 2 to n, where the scan cells of the first stage are coupled to corresponding miscellaneous logic, where the scan cells of each stage are coupled to corresponding scan cells of a next stage; and where scan logic is coupled to the scan cells of a predetermined stage, the method comprising the steps of:
 triggering the scan cells of N stages;
 shifting the data from the miscellaneous logic into the scan cells of the first stage and shifting the data from each of the scan cells into corresponding scan cells of a next stage responsive to the triggering step; and
 clocking the scan cells of the predetermined stage to shift data via a scan path.

18. The method of claim 17 wherein the scan path is in accordance with IEEE 1149.1 bus standard.

19. The method of claim 17 wherein the scan cells of the predetermined stage are coupled to form the scan path.

20. The method of claim 17 further comprising the step of shifting the data N times before clocking the scan cells of the predetermined stage.

21. The method of claim 17 wherein the predetermined stage is the Nth stage.

22. The method of claim 17, further comprising the step of shifting data via the scan path into a debug system.

23. The method of claim 22 wherein the debug system includes an external tester.

* * * * *